United States Patent
Eguchi et al.

(10) Patent No.: US 10,420,270 B2
(45) Date of Patent: Sep. 17, 2019

(54) COMPONENT SUPPLY DEVICE, COMPONENT MOUNTING SYSTEM, AND COMPONENT MOUNTING METHOD

(71) Applicant: Panasonic Intellectual Property Management Co., Ltd., Osaka (JP)

(72) Inventors: Ryouji Eguchi, Yamanashi (JP); Tatsuo Yamamura, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 71 days.

(21) Appl. No.: 15/190,394

(22) Filed: Jun. 23, 2016

(65) Prior Publication Data

US 2017/0020042 A1    Jan. 19, 2017

(30) Foreign Application Priority Data

Jul. 15, 2015 (JP) ................. 2015-140989

(51) Int. Cl.
*B23P 19/00* (2006.01)
*H05K 13/04* (2006.01)
(Continued)

(52) U.S. Cl.
CPC .............. *H05K 13/08* (2013.01); *H05K 3/30* (2013.01); *H05K 13/021* (2013.01); *H05K 13/0434* (2013.01); *H05K 13/081* (2018.08)

(58) Field of Classification Search
CPC .... H05K 3/30; H05K 13/0084; H05K 13/021; H05K 13/08; H05K 13/04; H05K 13/046
See application file for complete search history.

(56) References Cited

U.S. PATENT DOCUMENTS 5,727,311 A * 3/1998 Ida .................. H05K 13/021
29/740
7,003,872 B2 * 2/2006 Mimura ............... H05K 13/08
29/564.1
(Continued)

FOREIGN PATENT DOCUMENTS

JP    H01-123500 A    5/1989
JP    2004-146484 A    5/2004
(Continued)

*Primary Examiner* — Paul D Kim
(74) *Attorney, Agent, or Firm* — Pearne & Gordon LLP

(57) ABSTRACT

A component supply device of the disclosure includes: a loader being capable of accommodating a plurality of stick cases in a stacked state; a component transporting path transporting one or more electronic components supplied from the plurality of stick cases to a predetermined component supply position; a component detector being disposed on the component transporting path, the component detector detecting one or more electronic components on the component transporting path; a component number measurer measuring a first number of electronic components based on the detection result of the component detector; and a determiner determining a change of stick case which supplies one or more electronic components to the component supply position based on the first number of electronic components measured by the component number measurer and a second number of electronic components unloaded from the component supply position.

18 Claims, 14 Drawing Sheets

(51) Int. Cl.
*H05K 13/08* (2006.01)
*H05K 3/30* (2006.01)
*H05K 13/02* (2006.01)

(56) References Cited

U.S. PATENT DOCUMENTS

| | | | |
|---|---|---|---|
| 8,196,294 B2* | 6/2012 | Kino | H05K 13/0408 |
| | | | 226/110 |
| 8,328,498 B2* | 12/2012 | Higashida | H05K 13/0452 |
| | | | 414/749.4 |
| 2005/0036274 A1 | 2/2005 | Suhara et al. | |
| 2005/0071997 A1* | 4/2005 | Oyama | H05K 13/0413 |
| | | | 29/832 |
| 2008/0147232 A1* | 6/2008 | Kuribayashi | H05K 13/08 |
| | | | 700/160 |
| 2013/0297056 A1 | 11/2013 | Miyamoto et al. | |

FOREIGN PATENT DOCUMENTS

| | | |
|---|---|---|
| JP | 2005-032899 A | 2/2005 |
| JP | 2007-109779 | 4/2007 |
| JP | 2013-251532 A | 12/2013 |

* cited by examiner

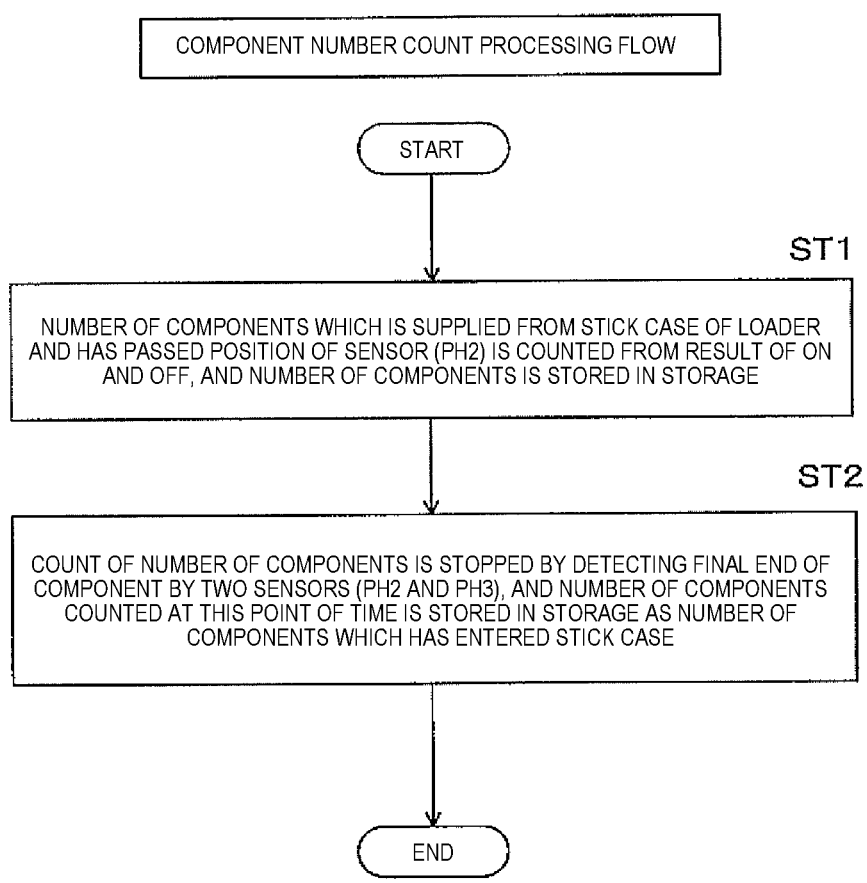

COMPONENT SUPPLY DEVICE, COMPONENT MOUNTING SYSTEM, AND COMPONENT MOUNTING METHOD

BACKGROUND

1. Technical Field

The present disclosure relates to a component supply device which supplies an electronic component, a component mounting system which uses the component supply device, and a component mounting method.

2. Description of the Related Art

In a component mounting system which mounts an electronic component on a substrate, a component mounting operation of unloading the electronic component from a component supply device, such as a tape feeder set in a component mounting device and transferring and loading the electronic component on the substrate, is repeatedly performed. A component mounting device which has a traceability managing function and is capable of performing a post-retrospective trace by managing and recording a component type or manufacturing lot of the electronic component supplied by the component supply device in the related art, from requirements on the quality management or production management in the component mounting operation, is known (for example, refer to PTL 1). In the related art illustrated in the PTL, it is described that by reflecting timing when a joint of a carrier tape is detected by the tape feeder in mounting history data in which a unit mounting history which makes a mounting point at which the electronic component is loaded on the substrate correspond to the tape feeder which supplies the electronic component is written in a time-series order, and tape changing history information which divides a plurality of mounting points on the substrate for every carrier tape is created.

However, an example of the component supply device which is used in the component mounting device, is a stick feeder which uses a long hollow stick case as a carrier that accommodates the electronic component. In the stick feeder, when a plurality of stick cases in which a plurality of electronic components are accommodated in advance are layered, and one stick case becomes empty by unloading the electronic component, the component for the next target stick case is unloaded in order. In addition, even in the component supply by the stick feeder, it is desirable that the above-described traceability managing function is realized.

CITATION LIST

Patent Literature

PTL 1: Japanese Patent Unexamined Publication No. 2007-109779

SUMMARY

A component supply device of the disclosure includes: a loader being capable of accommodating a plurality of stick cases in a stacked state, each of the plurality of stick cases being capable of accommodating a plurality of electronic components, each of the plurality of stick cases having an opening in an end portion in a longitudinal direction; a component transporting path transporting one or more electronic components supplied from the plurality of stick cases to a component supply position; a component detector being disposed on the component transporting path, the component detector detecting one or more electronic components on the component transporting path; a component number measurer measuring a first number of the electronic components based on the detection result of the component detector; and a determiner determining a change of stick case which supplies one or more electronic components to the component supply position based on the first number of electronic components measured by the component number measurer and a second number of electronic components unloaded from the component supply position.

A component mounting system of the disclosure includes: a component mounting device including a component supply device; and a managing device which is connected to the component mounting device by a network. In addition, the component supply device includes a loader being capable of accommodating a plurality of stick cases in a stacked state, each of the plurality of stick cases being capable of accommodating a plurality of electronic components, each of the plurality of stick cases having an opening in an end portion in a longitudinal direction, and a component transporting path transporting one or more electronic components supplied from the plurality of stick cases to a component supply position. Furthermore, the component mounting device includes a component detector beign disposed on the component transporting path, the component detector detecting one or more electronic components on the component transporting path, a component number measurer measuring a first number of the electronic components based on the detection result of the component detector, and a determiner determining a change of stick case which supplies the electronic components to the component supply position based on the first number of electronic components measured by the component number measurer and a second number of electronic components unloaded from the component supply position.

In a component mounting method in the component mounting system of the disclosure, the component mounting system includes: a component mounting device including the component supply device; and a managing device which is connected to the component mounting device by a network, and the component supply device includes: a loader being capable of accommodating a plurality of stick cases in a stacked state, each of the plurality of stick cases being capable of accommodating a plurality of electronic components, each of the plurality of stick cases having an opening in an end portion in a longitudinal direction; and a component transporting path transporting one or more electronic components supplied from the plurality of stick cases to a predetermined component supply position. In addition, the component mounting method of the disclosure includes: detecting one or more electronic components on the component transporting path by a component detector; measuring a first number of electronic components based on the detection result of the component detector; and determining a change of stick case which supplies the electronic components to the component supply position based on the measured first number of electronic components and a second number of electronic components unloaded from the component supply position.

According to the disclosure, it is possible to correctly distinguish the change of the electronic component by a stick case unit in a stick feeder, and to accurately manage a lot or a type of the supplied electronic components.

BRIEF DESCRIPTION OF DRAWINGS

FIG. 8 is a flow diagram of the component number counting processing in the stick feeder of the embodiment of the disclosure;

DETAILED DESCRIPTION OF THE PREFERRED EMBODIMENT

Figure 1:
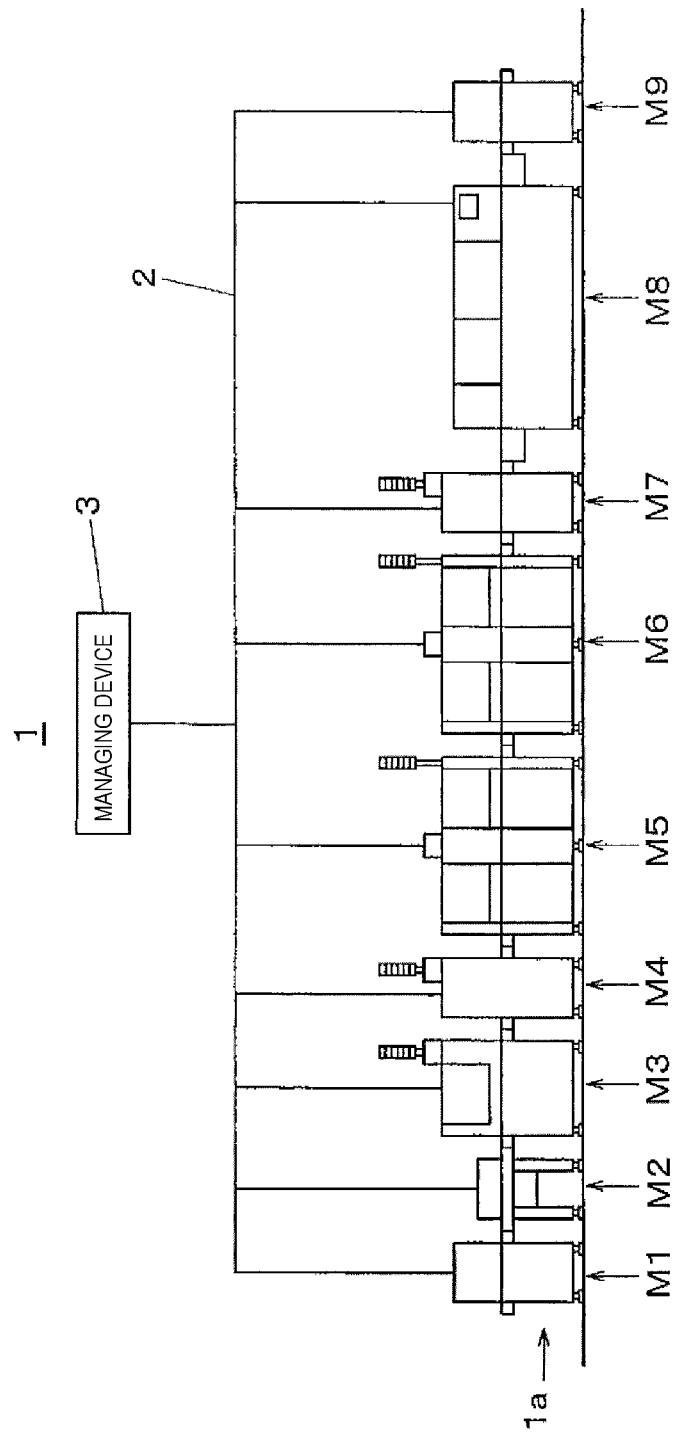
FIG. 1 is a configuration view illustrating a component mounting system of one embodiment of the disclosure.

Next, the embodiment of the disclosure will be described with reference to the drawings. First, with reference to FIG. 1, a configuration of component mounting system 1 will be described. Component mounting system 1 has a function of producing a mounting substrate by mounting the electronic component on the substrate by soldering. In order to perform the component mounting work, component mounting system 1 includes: a component mounting line 1a having a configuration in which substrate supply device M1, substrate delivery device M2, printing device M3, inspection device M4, component mounting devices M5 and M6, inspection device M7, reflow device M8, and substrate collecting device M9 are linked to each other; and managing device 3 which is connected to component mounting line 1a by network 2.

Substrate supply device M1 supplies substrate 6 (refer to FIG. 2) which is a target of the component mounting. Supplied substrate 6 is transported into printing device M3 via substrate delivery device M2. Printing device M3 performs screen printing with respect to the paste-like solder, such as a cream solder, on an electrode for component joining formed on substrate 6. Inspection device M4 performs quality determination of a printing state of the solder printed on the substrate, or printing inspection including the detection of printing position shift of the solder with respect to the electrode. Component mounting devices M5 and M6 consecutively load the electronic component on substrate 6 on which the solder is printed by printing device M3. Inspection device M7 inspects the component mounting state on substrate 6 after the electronic component is mounted. Reflow device M8 solders the electronic component on the substrate by melting the solder, and by heating substrate 6 after loading the electronic component according to a predetermined temperature profile. Substrate collecting device M9 collects substrate 6 after the reflow and substrate 6 which is a completed product on which the electronic component is mounted.

Figure 2:
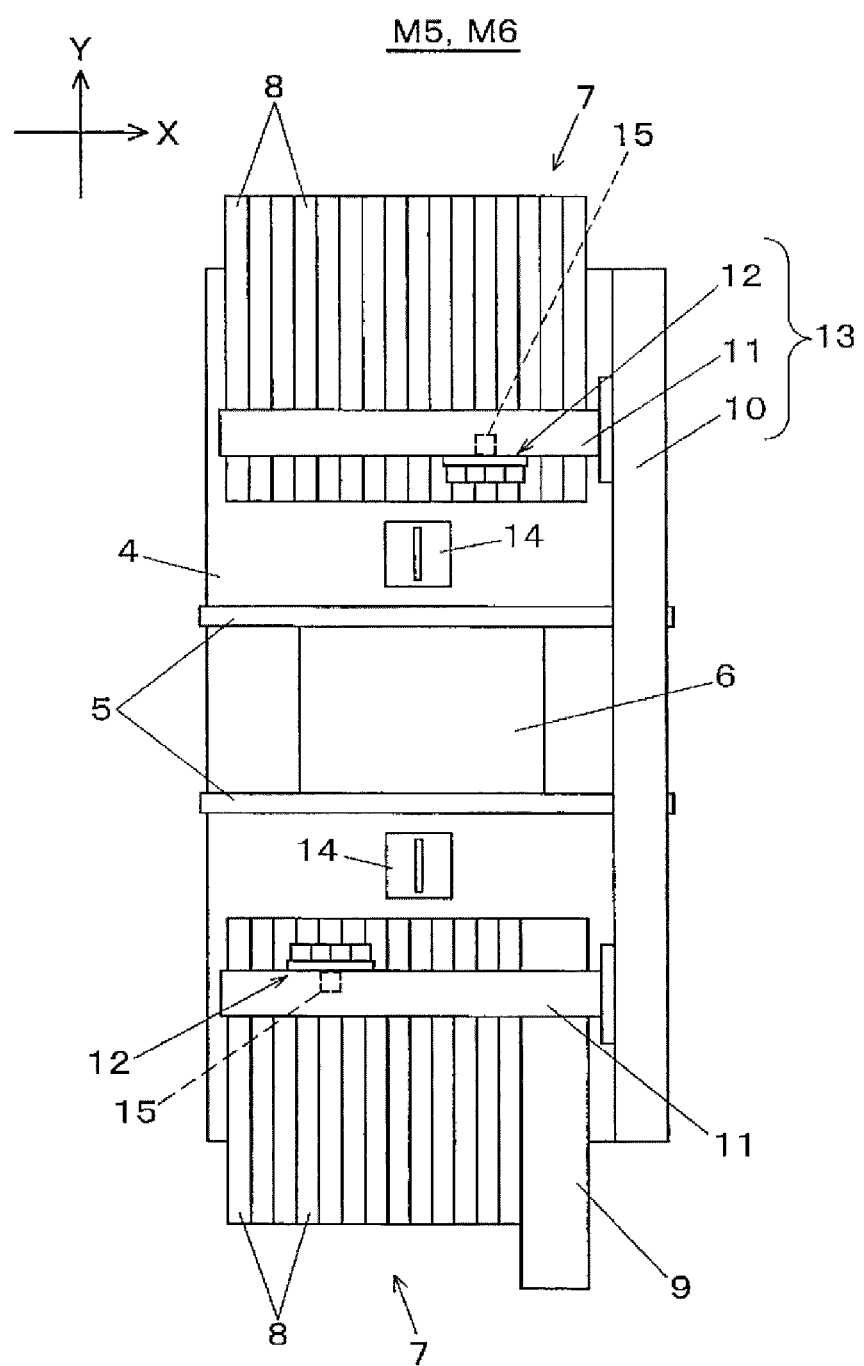
FIG. 2 is a plan view of a component mounting device which configures the component mounting system of the embodiment of the disclosure.

Next, with reference to FIG. 2, a configuration of component mounting devices M5 and M6 will be described. In FIG. 2, substrate transporting mechanism 5 is installed in the X direction (substrate transporting direction) at the center of base 4 in FIG. 2. Substrate transporting mechanism 5 transports substrate 6 transported from an upstream side, and positions and holds substrate 6 on a mounting stage set for performing the component mounting work. On both sides of substrate transporting mechanism 5, component suppliers 7 are disposed. A plurality of tape feeders 8 are mounted in parallel on one component supplier 7, and stick feeder 9 is mounted on the other component supplier 7 together with the plurality of tape feeders 8.

Tape feeder 8 supplies the electronic component to the component supply position toward a mounting head of the component mounting mechanism which will be described hereinafter, by pitch-feeding a carrier tape accommodated with the electronic component in the tape feeding direction. Stick feeder 9 similarly has a function as a component supply device, accommodates stick case 16 in which the plurality of electronic components are accommodated on the inside where an opening is present in the length direction in a stacked state, and similarly supplies the electronic component from stick case 16 to component supply position 28a (FIG. 3C) to the mounting head. In other words, component mounting system 1 illustrated in the embodiment includes component mounting devices M5 and M6 including stick feeder 9 which serves as a component supply device, and managing device 3 connected to component mounting devices M5 and M6 by network 2.

Y-axis moving table 10 having a linear driving mechanism is installed in an end portion on one side in the X direction on an upper surface of base 4, and two X-axis moving tables 11 similarly having the linear driving mechanism are combined with Y-axis moving table 10 to be freely movable in the Y direction. On two X-axis moving tables 11, each mounting head 12 is mounted to be freely movable in the X direction. By driving Y-axis moving table 10 and X-axis moving table 11, mounting head 12 moves in the X direction and in the Y direction. Accordingly, two mounting heads 12 unload the electronic component from the component supply position by tape feeder 8 or stick feeder 9 that are disposed in each corresponding component supplier 7, and transfer and load electronic component on substrate 6 positioned in substrate transporting mechanism 5. Y-axis moving table 10, X-axis moving table 11, and mounting head 12 configure component mounting mechanism 13 which suction, hold, and unload the electronic component from component supplier 7, and transfers and loads electronic component on substrate 6.

Component recognizing camera 14 is disposed between component supplier 7 and substrate transporting mechanism 5. When mounting head 12 which unloads the electronic component from component supplier 7 moves above component recognizing camera 14, component recognizing camera 14 captures and recognizes the electronic component in a state of being held by mounting head 12. Substrate recognizing camera 15 which is positioned on a lower surface side of X-axis moving table 11 and moves integrally with mounting head 12, is mounted on mounting head 12. As mounting head 12 moves, substrate recognizing camera 15 moves above substrate 6 positioned in substrate transporting mechanism 5, and captures and recognizes substrate 6. In the component mounting operation to substrate 6 by mounting head 12, loading position correction is performed based on the recognition result of the electronic component by component recognizing camera 14 and the substrate recognition result by substrate recognizing camera 15.

Next, with reference to FIGS. 3A to 3C, a configuration and a function of stick feeder 9 will be described. Stick feeder 9 includes loader 20 which accommodates the plurality of stick cases 16 in a stacked state, and component transporter 30. Component transporter 30 has a function of moving the electronic component supplied from accommodated stick case 16, to component supply position 28a supplied to mounting head 12 (FIG. 2) of component mounting mechanism 13. Loader 20 includes first guide 21 and second guide 22 which are installed in a posture of being inclined in the component supply direction, and are disposed being opposite to each other. Stacked space 20a for stacking the plurality of stick cases 16 between first guide 21 and second guide 22, is formed.

Figure 3:
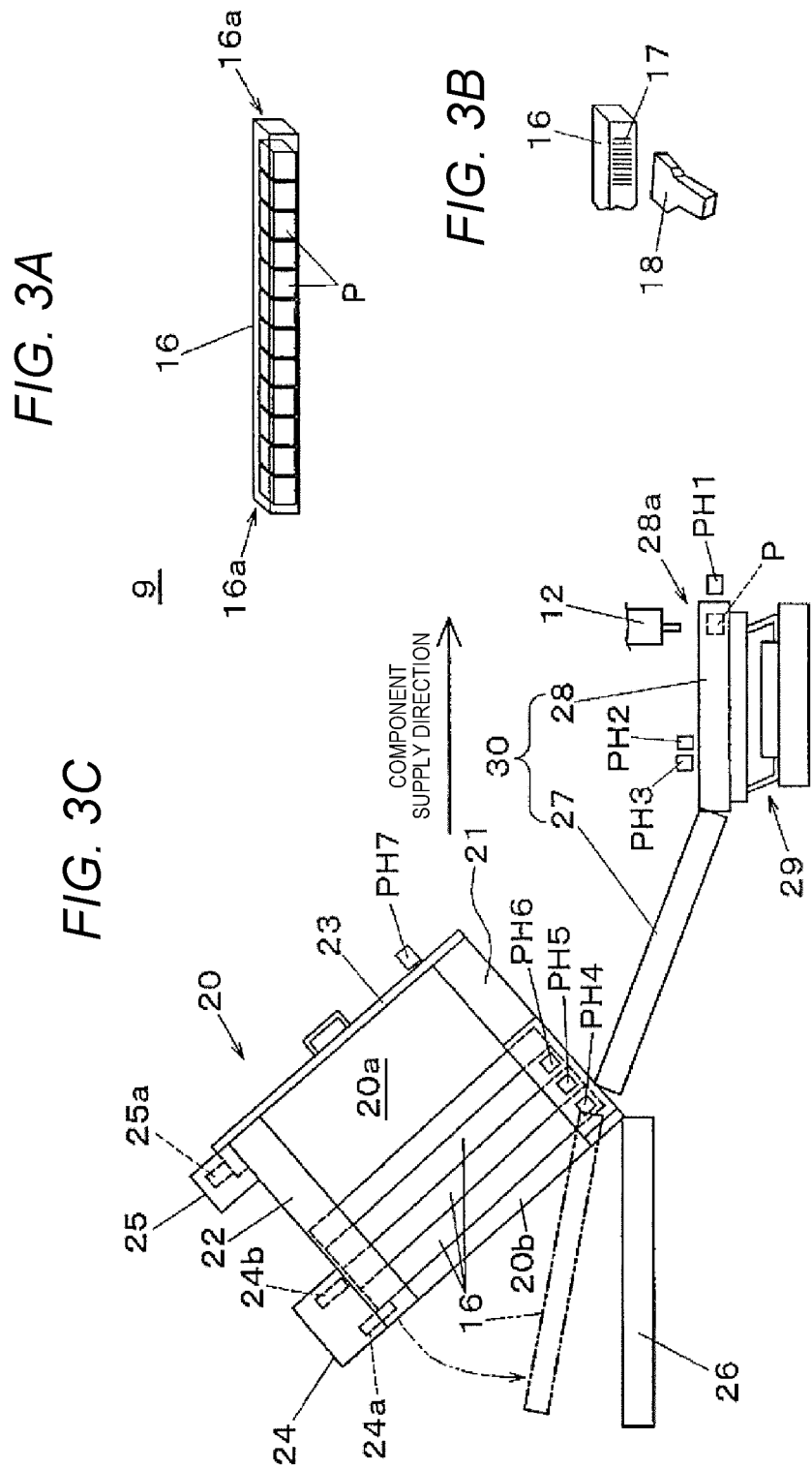
FIG. 3A is a configuration view illustrating a stick case of the embodiment of the disclosure.
FIG. 3B is a configuration view illustrating a bar code label of the stick case of the embodiment of the disclosure.
FIG. 3C is a configuration view illustrating a stick feeder (component supply device) of the embodiment of the disclosure.

As illustrated in FIG. 3A, stick case 16 is a hollow elongated container in which openings 16a are provided in both ends, and a plurality of electronic components P are accommodated in series on the inside of stick case 16. In other words, loader 20 has a function of stacking stick case 16 in which the plurality of electronic components P are accommodated, and which has an opening in the length direction.

As illustrated in FIG. 3B, bar code label 17 illustrating component information, such as the name of electronic component P accommodated in stick case 16 or the lot name, is attached to one side end surface of stick case 16, and when stick case 16 is set in loader 20, as an operator reads bar code label 17 by bar code reader 18, the component information is read and component collating processing is performed.

As illustrated in FIG. 3C, lid material 23 which is freely opened and closed is installed in an upper portion of first guide 21 and second guide 22. Lid material 23 has a function of blocking the opening for supplying stick case 16 to loader 20, and is capable of setting stick case 16 in stacked space 20a only in a state where lid material 23 is opened. In a state where stick case 16 is set in stacked space 20a, both end portions of stick case 16 in the longitudinal direction are guided by first guide 21 and second guide 22, and the position is held.

At this time, stick case 16 is in a posture of being inclined in the component supply direction, and a component transporting force in the inclination direction by gravity acts on electronic component P accommodated in stick case 16. Accordingly, electronic component P in stick case 16 positioned on the lowest step in stacked space 20a is transferred to slide linker 27 which is installed to be inclined in the component supply direction. In other words, the position on the lowest step in stacked space 20a becomes a supply position 20b which positions stick case 16 that is a component supply target in loader 20.

The end portion of slide linker 27 is linked to oscillation transporter 28 which is horizontally installed, and oscillation transporter 28 includes oscillation mechanism 29. In a state where oscillation mechanism 29 is driven, when electronic component P is transferred to oscillation transporter 28 from slide linker 27, electronic component P moves on oscillation transporter 28 in the component supply direction. In addition, electronic component P which has reached component supply position 28a is suctioned, held, and unloaded by mounting head 12.

In other words, slide linker 27 and oscillation transporter 28 configure component transporter 30 which moves electronic component P supplied from stick case 16 of loader 20 to predetermined component supply position 28a. In addition, a path through which electronic component P moves in slide linker 27 and oscillation transporter 28 becomes the component transporting path through which electronic component P supplied from stick case 16 of loader 20 is transported to predetermined component supply position 28a.

In second guide 22 on the opposite side in the component supply direction, stick discharge mechanism 24 and lid member locking mechanism 25 are provided. Stick discharge mechanism 24 has a function of dropping only stick case 16 on the lowest step and discharging stick case 16 to case collector 26 among the plurality of stick cases 16 accommodated in stacked space 20a, by controlling an advancing and retreating operation in stacked space 20a of two locking members 24a and 24b.

In other words, stick case 16 which feeds out all of electronic components P by the component supply and becomes empty is discharged and dropped by stick discharge mechanism 24, and is collected to case collector 26. Accordingly, next stick case 16 which is positioned directly on stick case 16 on the lowest step is positioned at the supply position of electronic component P. In other words, loader 20 includes a supply stick changer which changes stick case 16 positioned at the supply position 20b in loader 20.

Lid member locking mechanism 25 has a function of prohibiting an opening operation of closed lid material 23 by controlling the operation of locking member 25a. Accordingly, new stick case 16 is physically prohibited from being supplied to loader 20 in stick feeder 9, and the supply of electronic component P to loader 20 can be restricted only to the predetermined timing set in advance. Therefore, lid material 23 and lid member locking mechanism 25 function as a supply prohibitor which physically prohibits electronic component P from being supplied to loader 20.

In stick feeder 9, seven photo sensors (hereinafter, simply referred to as "sensor") PH1 to PH7 are equipped. Sensors PH1 to PH3 function as component detector 56 (refer to FIG. 4). In other words, sensor PH1 detects whether or not electronic component P has reached component supply position 28a in oscillation transporter 28. In addition, sensors PH2 and PH3 are disposed in oscillation transporter 28 which serves as the component transporting path, and detects electronic component P on the component transporting path, that is, the electronic component P in a state of being moved by oscillation transporter 28. Accordingly, the number of electronic components P which pass through oscillation transporter 28 is counted, and a terminal end of the lot of electronic component P supplied from one stick case 16 can be detected.

In addition, in the embodiment, an example in which two sensors PH2 and PH3 are disposed in oscillation transporter 28 is illustrated, but the positions of sensors PH2 and PH3 are not limited to oscillation transporter 28, and sensors PH2 and PH3 may be disposed in slide linker 27 which is a passing path of electronic component P. Furthermore, instead of installing two sensors PH2 and PH3 in parallel, the count of the number of electronic components P or the terminal end of the lot may be detected only by one sensor.

Among the accommodation positions of stick cases 16 in stacked space 20a, sensors PH4, PH5, and PH6 are installed in order from the lowest step at three lower accommodation positions. Sensors PH4, PH5, and PH6 function as stick case detector 57 (FIG. 4), and detect the presence or the absence of stick case 16 at each accommodation position. In other words, sensors PH4, PH5, and PH6 which function as stick case detector 57 detect the presence or the absence of the plurality of stick cases 16 stacked on loader 20. In lid material 23, sensor PH7 is provided. Sensor PH7 functions as lid member locking detector 58 (FIG. 4), and detects that lid material 23 is closed by lid member locking mechanism 25.

Figure 4:
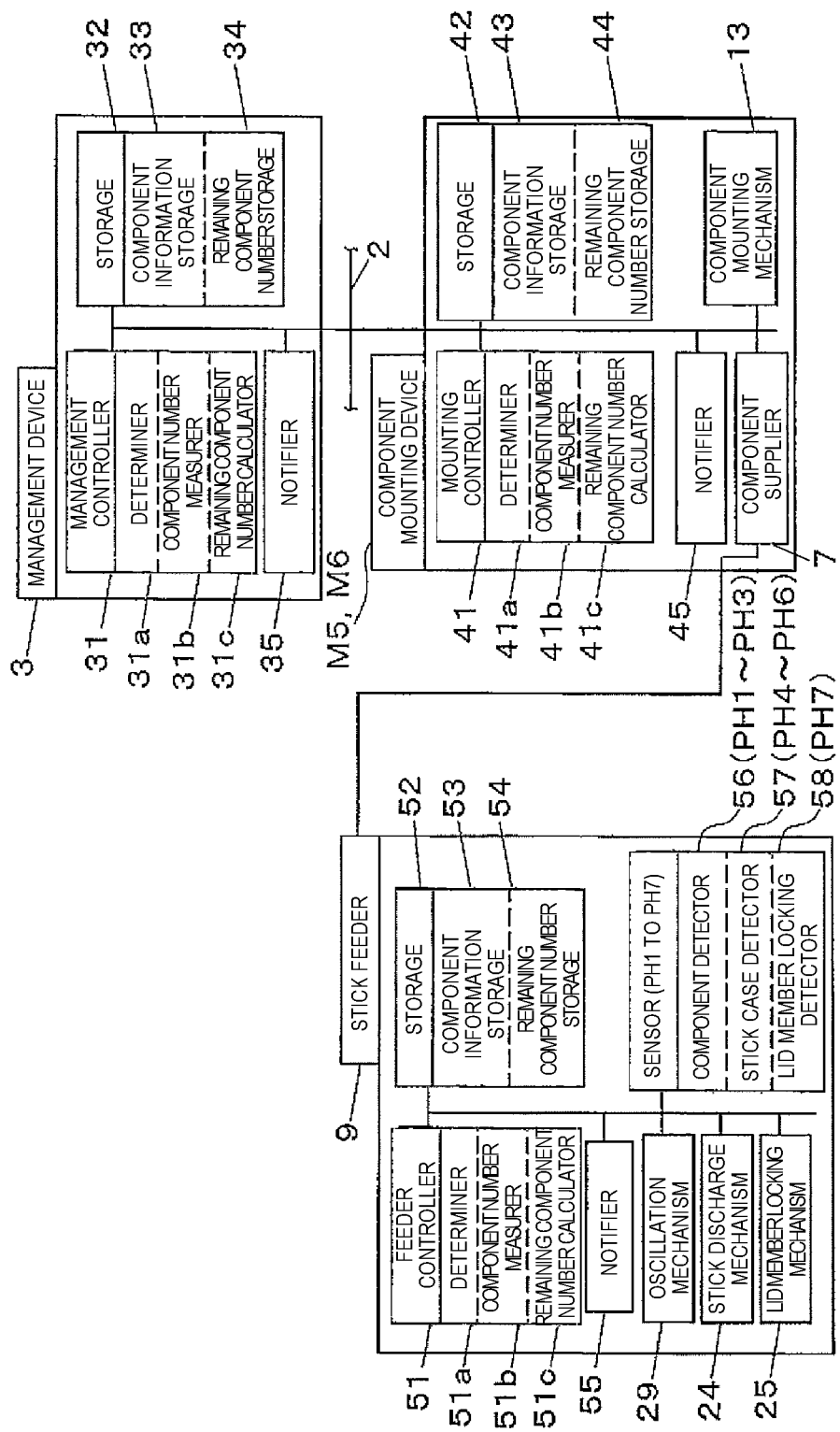
FIG. 4 is a block diagram illustrating a configuration of a control system of a component mounting system of the embodiment of the disclosure.
Figure 5:
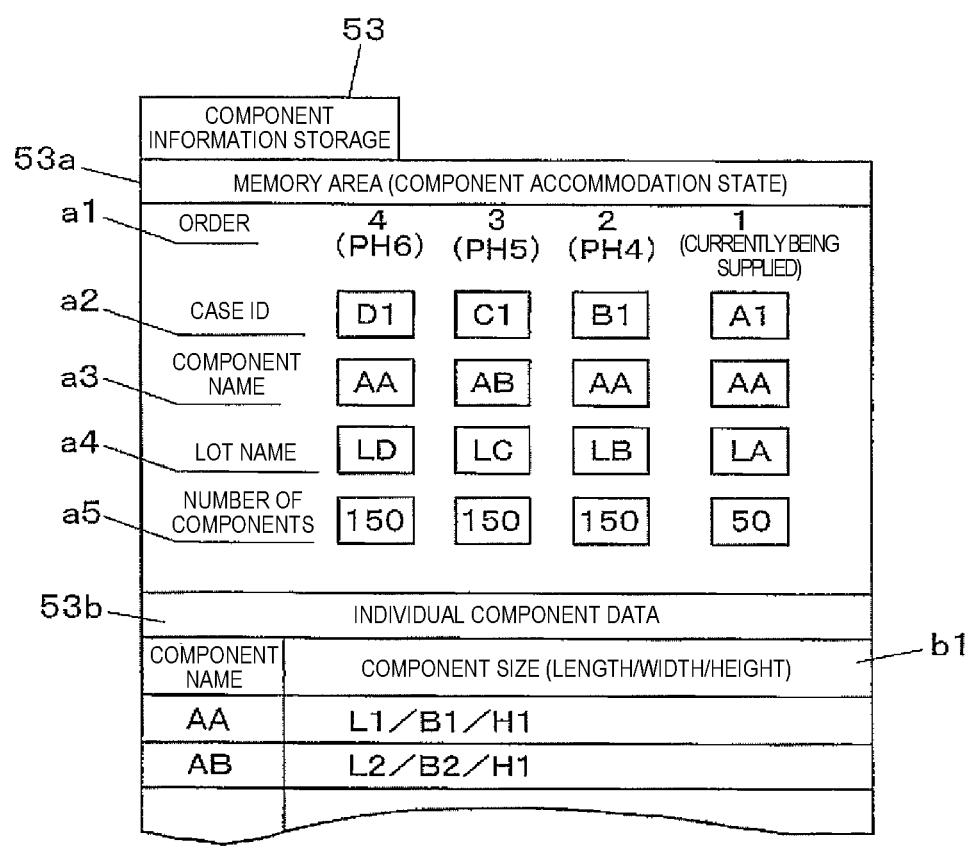
FIG. 5 is a view illustrating storage contents of component information storage in the stick feeder of the embodiment of the disclosure.

Next, with reference to FIGS. 4 and 5, a configuration of a control system will be described. In FIG. 4, stick feeder 9 includes feeder controller 51, storage 52, and notifier 55. Furthermore, feeder controller 51 includes determiner 51a, component number measurer 51b, and remaining component number calculator 51c, and storage 52 stores various programs or data which are necessary in the component supply operation in addition to data stored in component information storage 53 and remaining component number storage 54. Component information storage 53 stores the component information of stick case 16 stacked on loader 20, that is, memory area 53a and individual component data 53b that are illustrated in FIG. 5, are stored. Remaining component number storage 54 stores the remaining number of components accommodated in stick feeder 9 at each timing in real time Memory area 53a records trace information which is data illustrating a state of component accommodation in stick feeder 9, and illustrating a component supply history by stick feeder 9. Here, every time new stick case 16 is supplied to loader 20, as the operator reads bar code label 17 by bar code reader 18, the component information is input. Individual component data 53b stores attribute data which regulates characteristics of each electronic component, such as component size b1 illustrating the length/width/height of the electronic component, for each component type (component name).

Here, a configuration of memory area 53a will be described. Memory area 53a has a configuration in which each item of "case ID" a2, "component name" a3, "lot name" a4, and "number of components" a5 corresponds to the component supply order illustrated by "order" a1. Here, the order 1 illustrating "order" a1 reaches component supply position 28a and corresponds to electronic component P detected by sensor PH1. The orders 2, 3, and 4 correspond to stick cases 16 positioned in order from the lower end side of stacked space 20a in loader 20, and become detection targets by each of sensor PH4, sensor PH5, and sensor PH6.

"Case ID" a2 is an identification code which individually specifies stick case 16, and the example illustrated in FIG. 5, (A1) illustrated in the order 1 illustrates that electronic component P which has reached component supply position 28a and is currently being supplied is the electronic component unloaded from case ID(A1). In addition, (B1), (C1), and (D1) which respectively correspond to the orders 2, 3, and 4 illustrate the case ID which specifies stick case 16 detected by each of sensors PH4, PH5, and PH6 that are stacked on stacked space 20a.

"Component name" a3 and "lot name" a4 illustrate the component name of the electronic component which corresponds to the above-described case ID, and the lot name. In addition, "number of components" a5 illustrates the number of components of the electronic component which corresponds to each "order" a1 in real time. In other words, in the orders 2, 3, and 4 illustrated in "order" a1, since stick case 16 which has not been used is accommodated as it is, (150) which is the initial component accommodation number is illustrated, and in the order 1, a current value (here, 50) which is obtained by subtracting the number of consumed components unloaded from component supply position 28a, from the initial component accommodation number in order, is illustrated.

Feeder controller 51 controls oscillation mechanism 29, stick discharge mechanism 24, and lid member locking mechanism 25, with reference to the detection result by component detector 56 and stick case detector 57, and based on various pieces of data and programs stored in storage 52. Accordingly, the component supply operation of transporting electronic component P supplied from stick case 16 stacked on loader 20 to component supply position 28a, and supplying electronic component P to mounting head 12, is performed.

In the component supply operation, determiner 51a determines a detection state of stick case detector 57, and a state of stick case 16 stacked on loader 20 from the component information of stick case 16 stored in component information storage 53 of storage 52. Furthermore, determiner 51a determines the change of the lot of the stick case unit, based on the number of electronic components measured by component number measurer 51b, and the number of electronic components unloaded from component supply position 28a.

In addition, component number measurer 51b measures the number of electronic components P based on the detection result of sensors PH2 and PH3 which serve as component detector 56. Remaining component number calculator 51c measures the number of remaining components based on the number of electronic components P measured by component number measurer 51b. The measurement result is stored in remaining component number storage 54. Notifier 55 is a display portion, such as a display panel or a signal tower, has a function of performing notification with respect to a work vehicle when a predetermined event regulated in advance occurs. The display panel displays a predetermined notification screen. The signal tower is turned on at a predetermined pattern.

Component mounting devices M5 and M6 include mounting controller 41, storage 42, and notifier 45. Furthermore, mounting controller 41 includes determiner 41a, component number measure 41b, and remaining component number calculator 41c, and storage 42 includes component information storage 43 and remaining component number storage 44. Mounting controller 41 controls component supplier 7 or component mounting mechanism 13 based on various pieces of data or programs stored in storage 42. Accordingly, the component mounting work of mounting electronic component P unloaded from component supplier 7 on substrate 6, is performed.

Managing device 3 includes management controller 31, storage 32, and notifier 35. Furthermore, management controller 31 includes determiner 31a, component number measurer 31b, and remaining component number calculator 31c, and storage 32 includes component information storage 33 and remaining component number storage 34. Management controller 31 manages each device of component mounting line 1a illustrated in FIG. 1 via network 2, based on various pieces of data or programs stored in storage 32. Accordingly, the component mounting work of mounting electronic component P on substrate 6 and producing the mounting substrate, is performed.

In addition, the functions of determiner 41a, component number measure 41b, and remaining component number calculator 41c, and further, the function of determiner 31a, component number measurer 31b, and remaining component number calculator 31c, are similar to the functions of determiner 51a, component number measurer 51b, and remaining component number calculator 51c. In addition, the configuration of information stored in component information storage 43 and remaining component number storage 44, and further, the configuration of information stored in component information storage 33 and remaining component number storage 34, are similar to the information stored in component information storage 53 and remaining component number storage 54. Therefore, the control processing performed by the control function of stick feeder 9 may be performed by the control function of component mounting devices M5 and M6, or by the control function of managing device 3.

Stick feeder 9, component mounting devices M5 and M6, and component mounting system 1 which are illustrated in the embodiment, are configured as described above, and component number count processing of counting the number of the electronic components supplied by stick feeder 9 in the component mounting method by component mounting system 1 having the above-described configuration, will be described.

Figure 6:
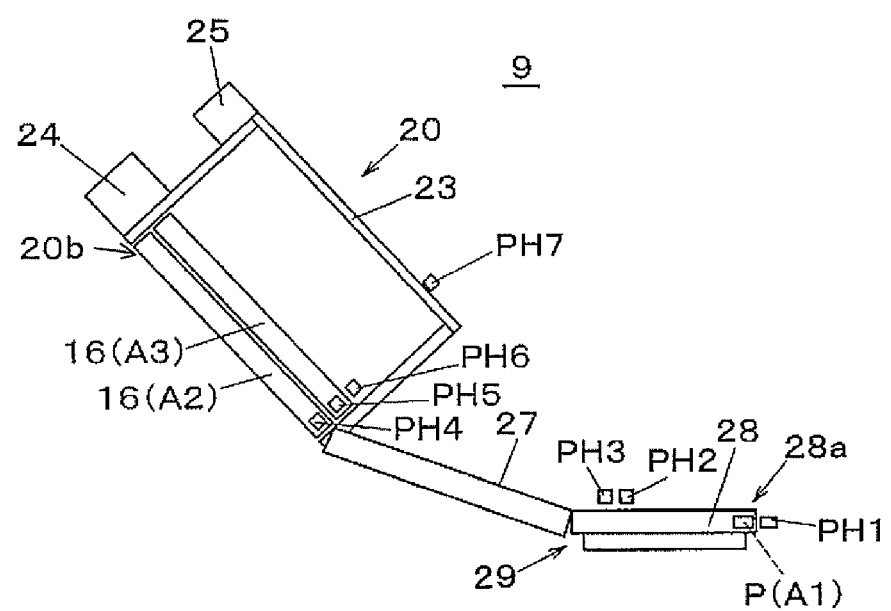
FIG. 6 is a view illustrating component number count processing in the stick feeder of the embodiment of the disclosure.

FIG. 6 illustrates a state of stick feeder 9 in the middle of the component supply. Here, in the process of consecutively supplying electronic component P from three stick cases 16(A1), 16(A2), and 16(A3), a state where the supply of the component from stick case 16(A1) is completed, stick case 16(A1) is discharged, and only stick cases 16(A2) and 16(A3) remain on loader 20, is illustrated.

Electronic component P(A1) supplied from stick case 16(A1) reaches component supply position 28a via slide linker 27 and oscillation transporter 28. The sensors (sensors PH2 and PH3) which serves as component detector 56 installed in oscillation transporter 28 detect that electronic component P transported from loader 20 to component supply position 28a passes. In addition, based on the detection result of component detector 56, the number of electronic components P, that is, the number of electronic components P transported from loader 20 to component supply position 28a, is measured by component number measurer 51b.

Figure 7A:
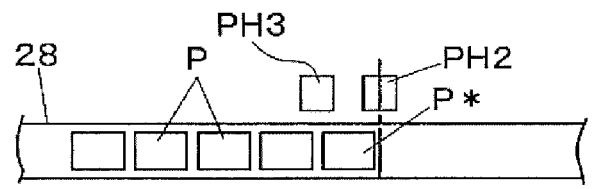
FIG. 7A is a view illustrating the component number count and detection processing of a component final end in the stick feeder of the embodiment of the disclosure.

Here, with reference to FIGS. 7A to 7F and 8, the component number count processing will be described. Here, an example in which sensor PH2 is used as component detector 56, is illustrated. FIG. 7A illustrates a state where electronic component P* which is a target of the number count at this timing among the plurality of electronic components P transported on oscillation transporter 28 which is the component transporting path, has moved to be near the detection position of sensor PH2 disposed at the predetermined position of the component detection.

Figure 7B:
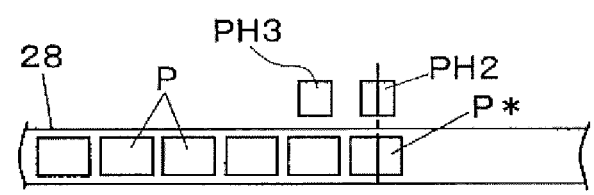
FIG. 7B is a view illustrating the component number count and the detection processing of the component final end in the stick feeder of the embodiment of the disclosure.
Figure 7C:
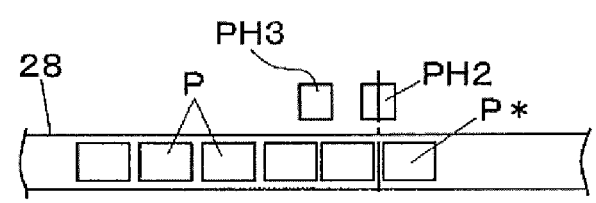
FIG. 7C is a view illustrating the component number count and the detection processing of the component final end in the stick feeder of the embodiment of the disclosure.
Figure 7D:
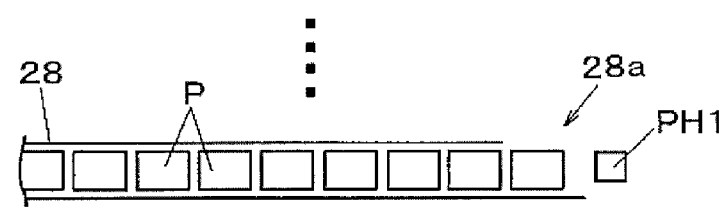
FIG. 7D is a view illustrating the component number count and the detection processing of the component final end in the stick feeder of the embodiment of the disclosure.

After this, as illustrated in FIG. 7B, as electronic component P* moves to the detection position of sensor PH2, sensor PH2 becomes ON, and the presence of electronic component P* is detected. In addition, as illustrated in FIG. 7C, as electronic component P* moves and sensor PH2 becomes OFF, it is detected that electronic component P* passes through the detection position of sensor PH2. In addition, it is detected that the following electronic components P also pass consecutively, and the level of the passing detection and the count number of components progress. After this, as illustrated in FIG. 7D, electronic component P which is transported in oscillation transporter 28 and has reached component supply position 28a, is detected by sensor PH1, and unloaded by mounting head 12 (FIG. 3B).

Figure 7E:
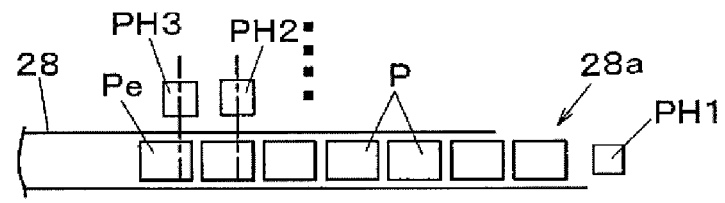
FIG. 7E is a view illustrating the component number count and the detection processing of the component final end in the stick feeder of the embodiment of the disclosure.
Figure 7F:
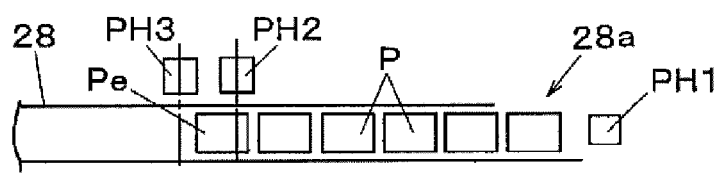
FIG. 7F is a view illustrating the component number count and the detection processing of the component final end in the stick feeder of the embodiment of the disclosure.

After this, as the above-described component transporting and unloading from component supply position 28a are repeatedly performed, all of the plural electronic components P of the same lot accommodated in the same stick case 16 are unloaded. Accordingly, the plurality of electronic components P are continuously transported by oscillation transporter 28, and as illustrated in FIG. 7E, electronic component Pe which is positioned at the final end of the lot reaches the position detected by sensor PH3. In addition, as a state illustrated in FIG. 7F, that is, a state where sensor PH2 detects electronic component Pe and sensor PH3 does not detect electronic component P is detected, it is detected that the final end of the plurality of electronic components P included in one lot passes through the position of sensor PH3.

The above-described component number count will be described according to the flow of FIG. 8. In other words, when the processing is started, first, the number of the components supplied from stick case 16 of loader 20 passing through the position of sensor PH2, is counted from the result of making ON and OFF of sensor PH2, and the result is stored in component information storage 53 of storage 52 (ST1). In other words, component detector 56 detects the passage of electronic component P at the position of sensor PH2 which is at the predetermined position on the component transporting path. Next, by detecting the final end of the component by two sensors (PH2 and PH3), that is, the final end of the plurality of electronic components P of the same lot, the count of the component number is stopped, and the component number counted at this point of time is stored in component information storage 53 of storage 52 as the number of components which has entered stick case 16 (ST2).

In the above-described component number count processing, the passage of electronic component P is detected by sensor PH2 which serves as component detector 56, and the number of electronic components P is measured by component number measurer 51b based on the detection result of sensor PH2. In addition, by subtracting the number of electronic components P unloaded from component supply position 28a by mounting head 12 from the component number measured by component number measurer 51b, the remaining component number at this point of time is acquired, and is stored in remaining component number storage 54.

Next, component lot changing processing when changing the stick case will be described. The component lot changing processing records that the supply source of electronic component P has changed from one stick case 16 to next stick case 16 in the trace information illustrating the component supply history. In the example illustrated in the embodiment, by the processing function of determiner 51a, the change of the lot by the stick case unit is determined based on the number of electronic components P measured by component number measurer 51b and the number of electronic components P unloaded from component supply position 28a.

Figure 9:
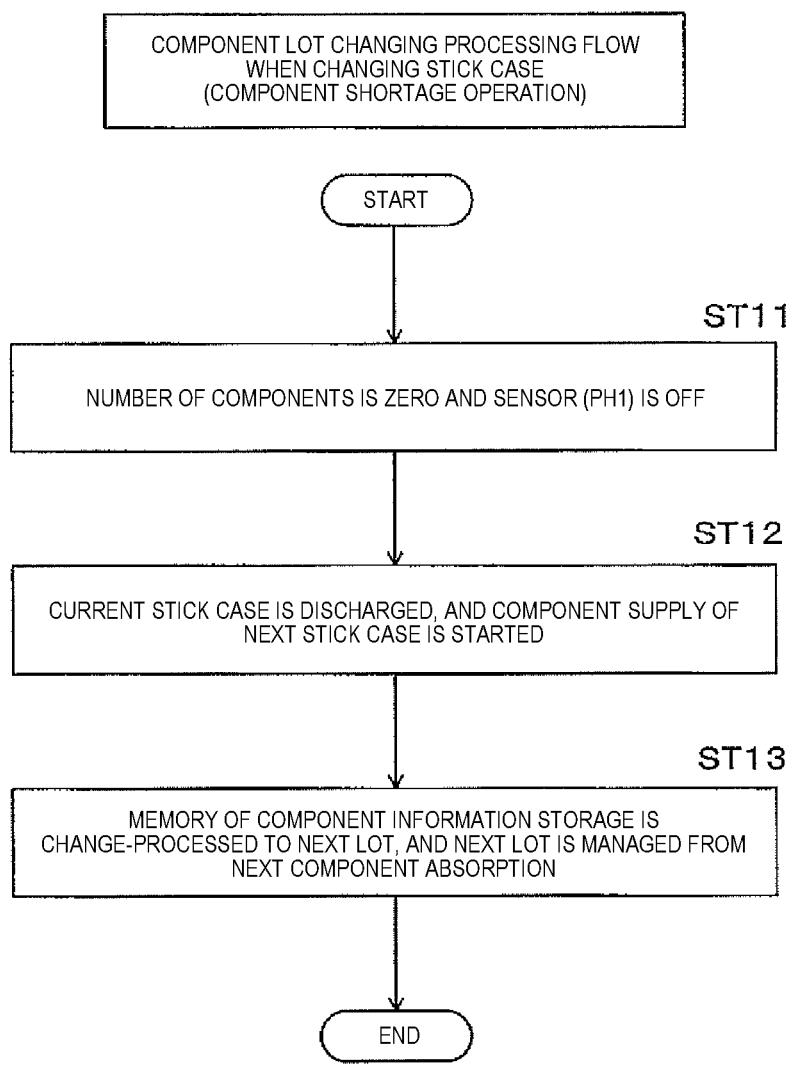
FIG. 9 is a flow diagram of component lot changing processing when changing the stick case in the stick feeder of the embodiment of the disclosure.

First, with reference to FIG. 9, a method of performing the component lot change (component shortage operation) by using occurrence of the component shortage in component supply position 28a in which electronic component P is unloaded from stick feeder 9 as a trigger will be described. When the processing is started, first, it is confirmed that the remaining component number is zero, and the sensor (PH1) is OFF (ST11). In other words, it is confirmed that the remaining component number of the components supplied from stick case 16 stored in remaining component number storage 54 is zero, that electronic component P is not present in current stick case 16 by data, and that electronic component P is not present at component supply position 28a as sensor PH1 is OFF. Accordingly, it is confirmed that the supply to the lot of electronic component P supplied from current stick case 16 is completed.

Next, current stick case 16 is discharged, and the component supply from the next stick case is started (ST12). In other words, stick case 16 which is accommodated at the lowest step in loader 20, has completed the component supply, and is empty, is discharged by the function of stick discharge mechanism 24. In addition, stick case 16 which is scheduled to supply the component next is positioned at the lowest position (supply position 20b). Accordingly, the supply of electronic component P accommodated in next stick case 16 is started, and electronic component P moves to component supply position 28a via slide linker 27 and oscillation transporter 28. Next, the changing processing to the next lot is performed with respect to memory area 53a stored in component information storage 53 of storage 52, and the next lot is managed from the next component adsorption (ST13). In other words, in memory area 53a, "lot name" a4 of electronic component P which is currently being supplied, is rewritten as "lot name" a4 which corresponds to new stick case 16.

Figure 10:
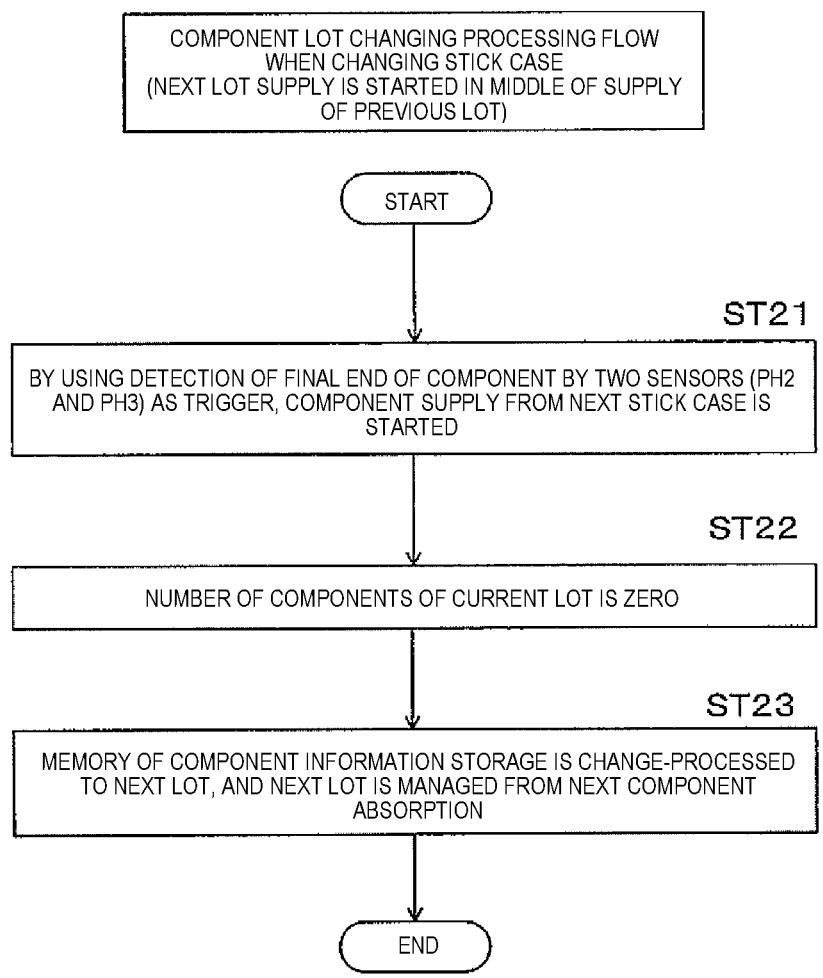
FIG. 10 is a flow diagram of the component lot changing processing when changing the stick case in the stick feeder of the embodiment of the disclosure.

Next, with reference to FIG. 10, the component lot changing in a case where the component supply of the next lot is started in the middle of the component supply of the lot without the component shortage at component supply position 28a, will be described. When the processing is started, by using the detection of the final end of the electronic component by two sensors PH2 and PH3 as a trigger, current stick case 16 is discharged, and the component supply from the next stick case is started (ST21). In other words, by a detection method of the final end of the electronic component illustrated in FIGS. 7E and 7F, the final end (electronic component P of the final portion) of the lot of electronic component P supplied from current stick case 16 is detected, and next, stick case 16 which has completed the supply of the electronic component and is empty is discharged by the function of stick discharge mechanism 24. Next, stick case 16 which is scheduled to supply the component next is positioned at the lowest position (supply position 20b). Accordingly, the supply of electronic component P accommodated in next stick case 16 is started, and electronic component P moves toward component supply position 28a via slide linker 27 and oscillation transporter 28.

In addition, a timing at which the component number of the current lot becomes zero is detected (ST22). In other words, at a timing before electronic component P supplied from next stick case 16 reaches component supply position 28a, it is detected that the remaining component number of the current lot stored in remaining component number storage 54 becomes zero. Next, by using the zero remaining component number of the current lot as a trigger, the changing processing to the next lot is performed with respect to memory area 53a stored in component information storage 53 of storage 52 is performed, and the next lot is managed from the next component adsorption (ST23). In other words, in memory area 53a, the "lot name" a4 of electronic component P which is currently being supplied, is rewritten as "lot name" a4 which corresponds to new stick case 16.

In stick feeder 9 having the above-described function, sensors PH2 and PH3 which serve as component detector 56 are configured to detect electronic component P at the tail among electronic components P supplied from stick case 16 of the current lot. In addition, when electronic component P at the tail is detected by component detector 56, stick discharge mechanism 24 which serves as the supply stick changer positions stick case 16 of the next lot of the current lot at supply position 20b on loader 20, and starts the component supply from stick case 16 of the next lot.

In addition, in stick feeder 9 having the above-described configuration, loader 20 is disposed to be inclined in the component supply direction, and stick case 16 accommodated in loader 20 is transferred to slide linker 27 by gravity. However, similar to stick feeder 9A illustrated in FIG. 11A, a configuration in which stacker 20A which is horizontally disposed is provided may be employed.

Figure 11A:
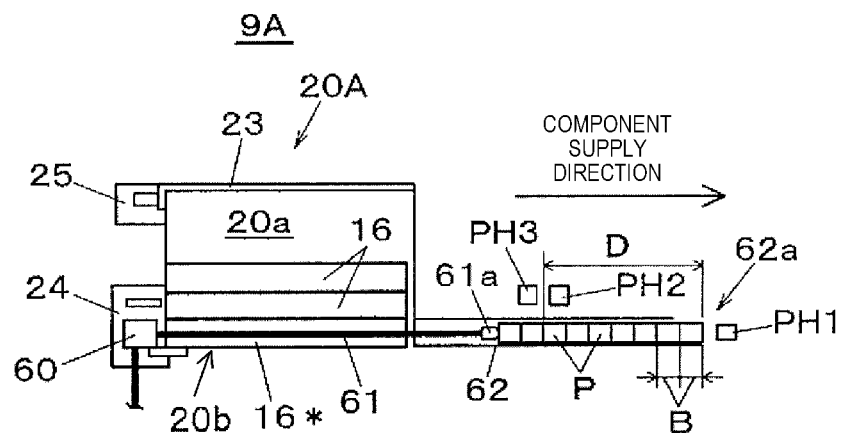
FIG. 11A is a view illustrating the detection processing of the component final end in the stick feeder of the embodiment of the disclosure.

In FIG. 11A, similar to loader 20 illustrated in FIG. 3C, stacker 20A provided in stick feeder 9A has stacked space 20a in which the plurality of stick cases 16 are accommodated to be stacked. Stacker 20A includes lid material 23 having a function similar to loader 20, stick discharge mechanism 24, and lid member locking mechanism 25. In stick feeder 9A, stacker 20A which is different from loader 20 installed in an inclined posture as illustrated in FIG. 3C, is disposed in a horizontal posture. Stick case 16* which is positioned at supply position 20b of the lowest step among stick cases 16 stacked in stacked space 20a, is at a position which is linked to component transporting path 62 installed in the component supply direction.

In stick discharge mechanism 24, pushing driver 60 which is positioned at the same height level as stick case 16* positioned at the lowest step, and makes pushing member 61 retreat in the component supply, is provided. By operating pushing driver 60, pushing member 61 passes through stick case 16*, and retreats into component transporting path 62. Accordingly, abutting part 61a provided at a tip end of pushing member 61 abuts against electronic component P accommodated in stick case 16*, and electronic component P is pushed into component transporting path 62.

By the pushing operation, electronic component P accommodated in stick case 16 supplied to stacker 20A moves into component transporting path 62 in the moving component supply direction without being pushed by pushing member 61 and generating a void therebetween. In addition, electronic component P which has reached component supply position 62a is unloaded by mounting head 12 (refer to FIG. 3C), and every time electronic component P is unloaded, electronic component P on component transporting path 62 which is the component transporting path is pushed in the direction of component supply position 62a. In the above-described configuration, pushing driver 60 and pushing member 61 configure component pusher which pushes electronic component P on the component transporting path in the direction of component supply position 62a every time electronic component P is unloaded from component supply position 62a.

On component transporting path 62 through which electronic component P pushed out of stick case 16* moves, at the position going backward in the component supply direction only by predetermined distance D from a reference position of component supply position 62a, two sensors PH2 and PH3 for detecting the final end are installed. In the example illustrated in FIGS. 11A to 11C, based on the above-described predetermined distance D and the size information (component width B) of electronic component P stored as individual component data 53b in storage 52, at the timing when the final end of the lot of electronic component P is detected, the number of electronic components P which are present between the positions going backward only by predetermined distance D from component supply position 62a, is acquired. In other words, component number measurer 51b measures the number of electronic components P, from the detection result of component detector 56 in a state where electronic component P is pushed by the above-described component pusher and the information regarding the size of electronic component P.

Figure 11B:
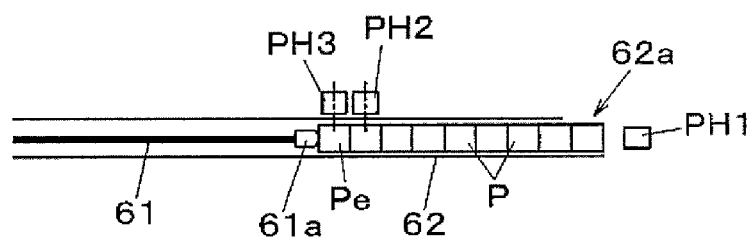
FIG. 11B is a view illustrating the detection processing of the component final end in the stick feeder of the embodiment of the disclosure.
Figure 11C:
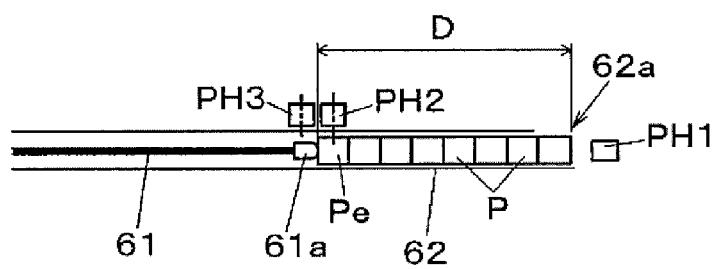
FIG. 11C is a view illustrating the detection processing of the component final end in the stick feeder of the embodiment of the disclosure.

FIG. 11B illustrates a process of delivering the plurality of electronic components P on component transporting path 62 toward component supply position 62a by pushing member 61. In the process, any of sensors PH2 and PH3 always detects electronic component P. In the detection state, electronic component Pe at the tail is continuous to reach the detection position of sensor PH3. In addition, as illustrated in FIG. 11C, while maintaining a state where sensor PH2 detects electronic component P, at a timing when electronic component Pe at the tail is shifted from the detection position of sensor PH3, the final end of the plurality of electronic components P of the same lot on component transporting path 62 is detected.

Figure 12:
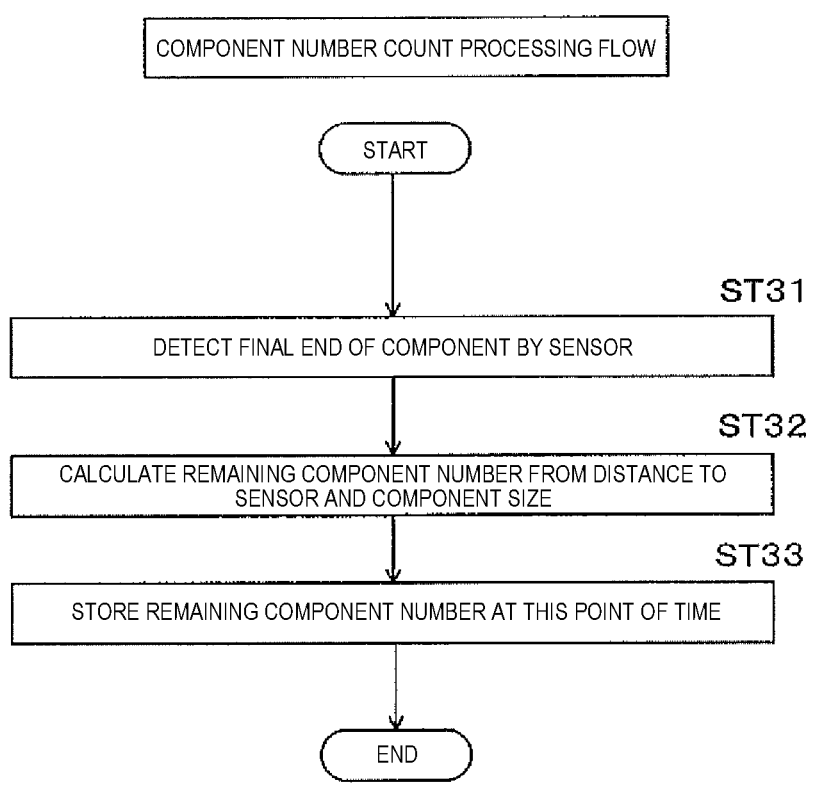
FIG. 12 is a flow diagram of the component number count processing in the stick feeder of the embodiment of the disclosure.

FIG. 12 illustrates a flow of the component number count processing in stick feeder 9A having the configuration illustrated in FIG. 11A. When the processing is started, the final end of the plurality of electronic components P on component transporting path 62 is detected by the sensors (sensors PH2 and PH3) (ST31). Next, the remaining component number is calculated from the distance to the sensor and the component size (ST32). In other words, the number of electronic components P which are present between component supply position 62a and sensors PH2 and PH3 is calculated by component number measurer 51b, from predetermined distance D and component width B illustrated in FIG. 11A (ST32). In other words, component number measurer 51b determines the position of electronic component P at the rearmost end on the component transporting path in a state where electronic component P is pushed by the component pusher, from the detection result of component detector 56, and measures the number of electronic components P. In addition, the calculated component number is stored in remaining component number storage 54 as the remaining component number at this point of time (ST33), and accordingly, the component number count processing is completed.

Figure 13:
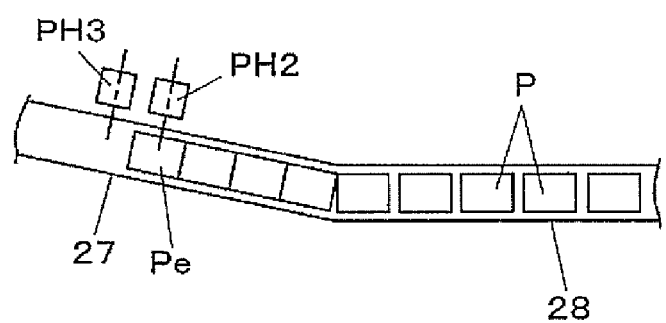
FIG. 13 is a view illustrating the detection processing of the component final end in the stick feeder of the embodiment of the disclosure.

In addition, similar to stick feeder 9A illustrated in FIG. 11A, without using a configuration in which electronic component P is pushed by pushing member 61, the final end of electronic component P may be detected by slide linker 27 illustrated in FIG. 3C. In other words, as illustrated in FIG. 13, the plurality of electronic components P which are in the middle of moving slide linker 27 by gravity, continuously moves without generation of a void therebetween, similar to a case moving on component transporting path 62 in stick feeder 9A. In this manner, within a range in which the plurality of electronic components P continuously move, similar to the example illustrated in FIGS. 11A to 11C, the sensors (sensor PH2 and sensor PH3) are disposed. Accordingly, similar to the detection example illustrated in FIG. 11C, while maintaining a state where sensor PH2 detects electronic component P, at a timing when electronic component Pe at the tail is shifted from the detection position of sensor PH3, the final end of continuous electronic components P on component transporting path 62 is detected.

Figure 14:
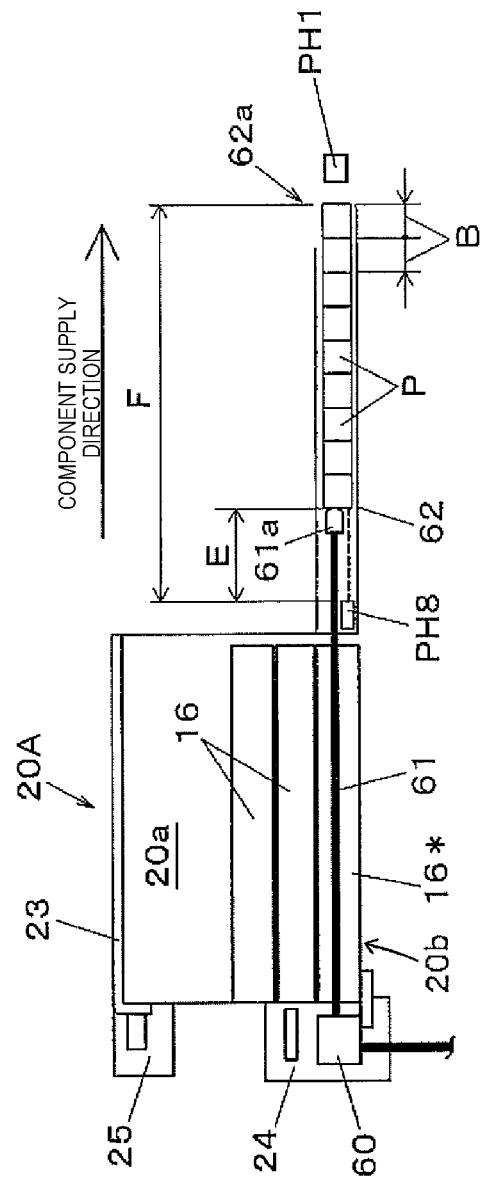
FIG. 14 is a view illustrating the detection processing of the component final end in the stick feeder of the embodiment of the disclosure.

In addition, as illustrated in FIG. 14, instead of sensors PH2 and PH3 of stick feeder 9A in FIG. 11A, sensor PH8 which has a sensor optical axis along the transporting direction on the rear side of component transporting path 62 in the transporting direction may be disposed, and the component final end position on component transporting path 62 may be detected. Specifically, when electronic component P is pushed by pushing member 61, component number measurer 51b calculates distance from component supply position 62a to the final end of electronic component P, from distance E from sensor PH8 to the final end of electronic component P and distance F from sensor PH8 to component supply position 62a which are detected by sensor PH8. Furthermore, component number measurer 51b calculates the remaining component number from the calculated distance from component supply position 62a to the final end of electronic component P and the component size. The processing after calculating the remaining component number is similar to the above-described other examples.

As described above, in stick feeder 9, component mounting system 1, and the component mounting method illustrated in the embodiment, in stick feeder 9 which supplies the electronic component accommodated in stick case 16, loader 20 which stacks stick cases 16; the component transporting path which moves the component supplied from stick case 16 of loader 20 to the predetermined component supply position; component detector 56 which is positioned on the component transporting path and detects electronic component P on the component transporting path; component number measurer 51b which measures the number of electronic components P based on the detection result of component detector 56; and determiner 51a which determines the change of the lot by the stick case unit based on the number of electronic components P measured by component number measurer 51b and the number of electronic components P unloaded from component supply position 28a, are included.

In other words, in stick feeder 9 (component supply device), component mounting system 1, and the component mounting method illustrated in the embodiment, loader 20 being capable of accommodating stick cases 16 in a stacked state, each of stick cases 16 is capable of accommodating electronic components P, each of stick cases 16 which has opening 16a at the end portion in the longitudinal direction; component transporting path 62 which transports one or more electronic components P supplied from stick cases 16 to predetermined component supply position 28a; component detector 56 which is disposed on component transporting path 62, and detects one or more electronic components P on the component transporting path; component number measurer 51b which measures the number of electronic components based on the detection result of component detector 56; and determiner 51a which determines the change of stick case 16 which supplies electronic components P to component supply position 28a based on the number of the electronic components P measured by component number measurer 51b and the number of the electronic components P unloaded from component supply position 28a.

Accordingly, even in the aspect in which electronic component P accommodated in stick case 16 in a state of a piece, it is possible to correctly distinguish the change of the component by the stick case unit, and to accurately manage the lot or the type of supplied electronic component P.

In addition, in stick feeder 9 (component supply device), component mounting system 1, and the component mounting method illustrated in the embodiment, component detector 56 may detect the passage of one or more electronic components P at the predetermined position on component transporting path 62.

In addition, in stick feeder 9 (component supply device), component mounting system 1, and the component mounting method illustrated in the embodiment, storage 52 which stores information regarding the size of one or more electronic components P accommodated in stick cases 16, may further be provided, and component number measurer 51b may measure the number of electronic components P, from the detection result of component detector 56 and the information regarding the size of the electronic component P on component transporting path 62.

Furthermore, pushing member 61 (component pusher) which pushes one or more electronic components P on component transporting path 62 toward component supply position 28a every time electronic component P is unloaded from component supply position 28a, may further be provided, and component number measurer 51b may measure the number of electronic components P based on the detection result of component detector 56 in a state where one or more electronic components P are pushed by component pusher 61 (component pusher).

In addition, in stick feeder 9 (component supply device), component mounting system 1, and the component mounting method illustrated in the embodiment, loader 20 may further have stick discharge mechanism 24 (supply stick changer) which changes stick case 16 positioned at supply position 20b in loader 20, component detector 56 may detect electronic component P which is supplied last among one or more electronic components P supplied from stick case 16 (first stick case) positioned at supply position 20b, and stick discharge mechanism 24 (supply stick changer) may position stick case 16 (second stick case) which is different from stick case 16 (first stick case) at supply position 20b, and start the component supply from stick case 16 (second stick case), when component detector 56 detects the electronic component P.

The component supply device, the component mounting system, and the component mounting method of the disclosure have an effect that the change of the component by the stick case unit in the stick feeder can be correctly distinguished and the lot or the type of the supplied electronic components can be accurately managed, and are useful in the field of producing the mounting substrate by mounting the electronic component on the substrate.

What is claimed is:

1. A component supply device comprising:
    a loader being capable of accommodating a plurality of stick cases in a stacked state, each of the plurality of stick cases being capable of accommodating a plurality of electronic components;
    a component supply position at which a mounting head is configured to unload one or more electronic components, wherein the mounting head unloads the one or more electronic components and mounts the one or more electronic components onto a substrate;
    a component transporting path positioned between the loader and the component supply position, wherein the one or more electronic components are transported along the component transporting path from one of the plurality of stick cases to the component supply position;
    a component detector disposed on the component transporting path, wherein the component detector is configured to detect the one or more electronic components as the one or more electronic components are moved along the component transporting path;
    a component number measurer configured to count a number of electronic components detected by the component detector; and
    a determiner configured to determine a change of stick case by comparing the number of electronic components counted by the component number measurer with a number of electronic components unloaded from the component supply position.

2. The component supply device of claim 1,
    wherein the component detector detects that the one or more electronic components pass through a predetermined position on the component transporting path.

3. The component supply device of claim 1, further comprising:
    a storage storing information regarding a size of one or more electronic components accommodated in the plurality of stick cases,
    wherein the component number measurer uses the information regarding the size of the one or more electronic components to count the number of electronic components on the component transporting path.

4. The component supply device of claim 3, further comprising:
    a component pusher pushing the one or more electronic components on the component transporting path toward the component supply position every time one of the one or more electronic components is unloaded from the component supply position.

5. The component supply device of claim 4,
    wherein the component number measurer determines a position of an electronic component positioned to be a nearest to the component pusher on the component transporting path to count the number of electronic components on the component transporting path.

6. The component supply device of claim 1,
    wherein the loader includes a supply stick changer, the supply stick changer configured to change a stick case positioned at a supply position in the loader.

7. A component mounting system comprising:
    a component mounting device including a component supply device; and
    a managing device which is connected to the component mounting device by a network, wherein the component supply device includes:
- a loader having at least one stick case, the at least one stick case having one or more electronic components,
- a component transporting path wherein the one or more electronic components are moved from the at least one stick case to a component supply position at which a mounting head is configured to unload the one or more electronic components from the component supply position, and mount the one or more electronic components, and
- a component detector being disposed on the component transporting path, wherein the component detector is configured to detect each of the one or more electronic components as the one or more electronic components move between the at least one stick case and the component supply position, and wherein at least one of the component mounting device, managing device, and
component supply device includes:
- a component number measurer configured to count a number of electronic components detected by the component detector, and
- a determiner configured to determine a change of stick case by comparing the number of electronic components counted by the component number measurer and a number of electronic components unloaded from the component supply position.

8. The component mounting system of claim 7,
wherein the component detector detects that the one or more electronic components pass through a predetermined position on the component transporting path.

9. The component mounting system of claim 7, further comprising:
a storing in which information is stored regarding a size of the one or more electronic components accommodated in the plurality of stick cases,
wherein the component number measurer uses the stored information regarding the size of the one or more electronic components to count the number of electronic components.

10. The component supply system of claim 9, further comprising:
a component pusher pushing the one or more electronic components on the component transporting path toward the component supply position every time one of the one or more electronic components is unloaded from the component supply position.

11. The component supply system of claim 10,
wherein the component number measurer determines a position of an electronic component positioned nearest to the component pusher on the component transporting path to count the number of electronic components on the component transporting path.

12. The component supply system of claim 7,
wherein the loader includes a supply stick changer, the supply stick changer configured to change a stick case positioned at a supply position in the loader.

13. A component mounting method in a component mounting system, the component mounting system including a component mounting device including a component supply device, and a managing device which is connected to the component mounting device by a network, the component supply device including a loader capable of accommodating a plurality of stick cases, each of the plurality of stick cases capable of accommodating a plurality of electronic components, a component transporting path through which the plurality of electronic components are moved out of the plurality of stick cases to a component supply position at which a mounting head is configured to unload the one or more electronic components from the component supply position and mount the one or more electronic components onto a substrate, the method comprising:
detecting the plurality of electronic components as each of the plurality of electronic components are passed by a component detector on the component transporting path;
measuring a number of electronic components based on at least in part on a detection result of the component detector; and
determining a change of stick case when a difference between the measured number of electronic components and a number of electronic components unloaded from the component supply position is zero.

14. The component mounting method of claim 13,
wherein the component detector detects when each of the plurality of electronic components pass through a predetermined position on the component transporting path.

15. The component mounting method of claim 13,
wherein measuring the number of electronic components is further based on information regarding a size of the plurality of electronic components on the component transporting path.

16. The component mounting method of claim 15, further comprising:
pushing the plurality of electronic components on the component transporting path toward the component supply position every time one of the plurality of electronic components is unloaded from the component supply position.

17. The component mounting method of claim 16, further comprising:
determining a position of an electronic component positioned nearest to the component pusher on the component transporting path, and
wherein measuring the number of electronic components is further based on the determined position of the electronic component positioned nearest the component pusher.

18. The component mounting method of claim 13,
wherein, when the component detector detects a last electronic component supplied from a first stick case positioned at the supply position, the first stick case is moved, a second stick case is positioned at the supply position, and a component supply from the second stick case is started.

* * * * *